US012408301B2

(12) United States Patent
Aiello et al.

(10) Patent No.: US 12,408,301 B2
(45) Date of Patent: Sep. 2, 2025

(54) THERMAL MODULE AND JOINING METHOD FOR HERMETICALLY SEALED ENCLOSURE OF A THERMAL MODULE USING A CAPILLARY JOINT

(71) Applicant: Apple Inc., Cupertino, CA (US)

(72) Inventors: Anthony J. Aiello, Santa Cruz, CA (US); Chetan Harsha Edara, Santa Clara, CA (US); Pavan Kumar Varma Buddaraju, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 236 days.

(21) Appl. No.: 18/199,851

(22) Filed: May 19, 2023

(65) Prior Publication Data

US 2024/0389269 A1    Nov. 21, 2024

(51) Int. Cl.
*H05K 7/20* (2006.01)
*G06F 1/20* (2006.01)

(52) U.S. Cl.
CPC ......... *H05K 7/20336* (2013.01); *G06F 1/203* (2013.01)

(58) Field of Classification Search
CPC . H01L 23/427; H01L 23/473; H01L 21/4882; H01L 2224/0401; H01L 2225/06589; H01L 2225/06586; H01L 23/04; H01L 23/055; H01L 23/3121; H01L 23/3675; H01L 23/3736; H01L 25/0652; H01L 25/0655; F28D 15/0233; F28D 15/04; F28D 15/046; F28D 15/02; F28D 15/0283; F28D 15/0275; F28D 2015/0216; F28D 2021/0028; H05K 7/20336; H05K 1/0203; H05K 1/181; H05K 2201/066; H05K 5/0217; H05K 5/0247; H05K 7/1427; H05K 7/20254; H05K 7/2039; F28F 3/12; F28F 2230/00; F28F 3/046; G06F 1/20; G06F 2200/201
See application file for complete search history.

(56) References Cited

U.S. PATENT DOCUMENTS

| | | | |
|---|---|---|---|
| 8,074,706 B2* | 12/2011 | Su | F28D 15/046 165/185 |
| 2002/0100968 A1* | 8/2002 | Zuo | H01L 23/427 257/715 |
| 2005/0162651 A1* | 7/2005 | Sim | G01N 21/55 356/394 |

(Continued)

*Primary Examiner* — Michael A Matey
(74) *Attorney, Agent, or Firm* — BAKERHOSTETLER

(57) ABSTRACT

A thermal module includes parts with diverging or divergent walls that cause a capillary pressure gradient in a bonding paste used to secure the parts together. Based in part on the capillary pressure, the bonding paste is drawn in between the divergent walls, including small gaps between the walls. Additionally, during a reflow operation of the bonding paste, particles and/or air bubbles can egress from the bonding paste, allowing the bonding paste to freeze and form a homogeneous structure. By removing particles and air bubbles, the bonding paste can form a more robust structural joint and a hermetic seal for the thermal module. The multiple parts of the thermal module can be formed into their respective shapes prior to be joined together by the bonding paste. As a result, the formation of the thermal module is less likely to damage other structures, such as wick structures.

20 Claims, 13 Drawing Sheets

(56) References Cited

U.S. PATENT DOCUMENTS

| | | | |
|---|---|---|---|
| 2008/0283222 A1* | 11/2008 | Chang | H01L 23/427 |
| | | | 165/104.26 |
| 2010/0071879 A1* | 3/2010 | Hou | F28D 15/046 |
| | | | 29/890.032 |
| 2010/0265709 A1* | 10/2010 | Liu | F21K 9/00 |
| | | | 362/249.02 |
| 2011/0174474 A1* | 7/2011 | Liu | C23C 28/30 |
| | | | 165/185 |
| 2016/0025428 A1* | 1/2016 | Hendrix | F28F 3/12 |
| | | | 165/166 |
| 2016/0290739 A1* | 10/2016 | Mochizuki | F28F 3/046 |
| 2021/0028088 A1* | 1/2021 | Brandenburg | H01L 23/04 |
| 2021/0195798 A1* | 6/2021 | Neal | H01L 23/3675 |
| 2022/0151113 A1* | 5/2022 | Hachiya | H05K 7/1427 |
| 2024/0395660 A1* | 11/2024 | Berberoglu | H01L 23/427 |

\* cited by examiner

THERMAL MODULE AND JOINING METHOD FOR HERMETICALLY SEALED ENCLOSURE OF A THERMAL MODULE USING A CAPILLARY JOINT

TECHNICAL FIELD

This application is directed to thermal modules, and more particularly, to thermal modules with parts having divergent walls that cause capillary forces in a bonding paste to position it between the divergent walls while it is in a molten state.

BACKGROUND

Thermal modules (e.g., heat pipe, vapor chamber) are used to transport heat (e.g., thermal energy) generated by a heat-generating component. When used in electronic devices, thermal modules can transport heat away from a heat-generating component (e.g., integrated circuit), thus allowing the heat-generating component to cool more rapidly. One solution to forming a thermal module includes bending or deforming a metal part from a circular cross section to a desired cross sectional shape, such as a lozenge shape. However, the formation process can damage one or more wick structures positioned along an inner surface of the metal, resulting in compromised performance of the thermal module. Another solution includes modifying a multi-piece thermal module to include flanges, and joining the pieces together at their respective flanges using diffusion bonding. However, the addition of flanges results in a smaller thermal module with less thermal transport performance. Alternatively, a thermal module built with a larger size/volume may be further increased due to the flanges, causing the thermal module to occupy additional space within an electronic device, which may lead to less space in the electronic device for other components.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
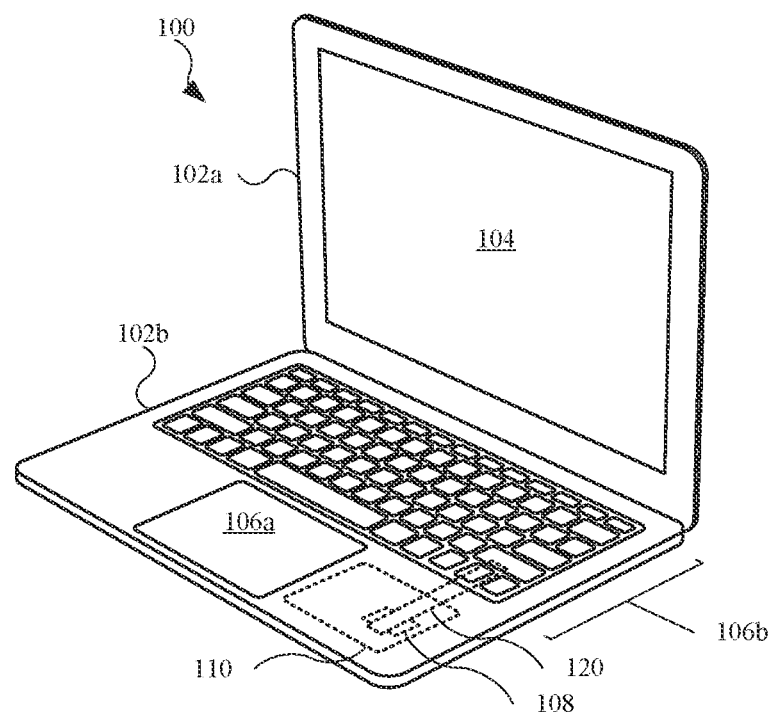
FIG. 1 illustrates an example of an electronic device, in accordance with aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject technology is directed to thermal modules with multiple parts (e.g., housing parts) secured together, with respective walls of the parts modified to promote flow of a bonding paste between the walls. For example, one of the walls may be formed at an angle (e.g., non-zero) such that the walls are divergent from, and non-parallel with respect to, each other. Accordingly, respective walls of the parts may extend in different directions. The bonding paste may be selected from copper paste or solder paste, as non-limiting examples. Accordingly, at room temperature the bonding paste is in a solid state, or solid form, and is converted to a liquid state, or liquid form, when heated to a temperature at or above the melting temperature of the bonding paste. Beneficially, the bonding paste in liquid state incurs a force (e.g., capillary pressure) and is drawn, or forced, between a gap of the divergent walls, thus increasing the contact surface area between the bonding paste and the walls. The bonding paste in a solid state thereafter provides a structural joint and hermetic seal between the parts of the thermal module. Capillary forces cause the molten liquid to form a concave meniscus due to the divergence angle between the opposing walls, and the capillary pressure gradient draws the molten liquid toward the root of the divergence and, in combination with buoyancy forces, purges bubbles of lower-density fluids (e.g., air, flux) out of the molten body through the meniscus surface. Once the molten liquid freezes back into a solid state, the joint is formed of a non-porous solid that provides a hermetic seal between the two now-joined parts of the enclosure.

The angle between the divergent walls can influence the force at which the bonding paste is drawn between the walls. In this regard, the angle may be selected so as to provide sufficient force to draw the bonding paste between the divergent, but limited so as to not force the bonding paste into an interior space (between the parts) and make contact with a wick structure(s) located in an interior volume, or space, between the parts.

Additionally, while heated and maintained in its liquid state, particles (e.g., lower-density fluids or particles, solder flux) and/or air bubbles can be forced out of the bonding paste due in part to the difference between the respective densities of the molten bonding paste and the particles, fluids, or air bubbles. When the bonding paste is removed from heat and reaches its freezing point, the bonding paste may form a homogeneous structure free, or substantially free, of particles and air bubbles. Beneficially, the structural joint and hermetic seal provided by the bonding paste is enhanced by the removal of the particles, fluids, and air bubbles.

These and other embodiments are discussed below with reference to FIGS. 1-17. However, those skilled in the art will readily appreciate that the detailed description given herein with respect to these Figures is for explanatory purposes only and should not be construed as limiting.

According to some embodiments, for example as shown in FIG. 1, an electronic device 100 takes the form of a laptop computing device. Electronic device 100 may include a housing component 102a (e.g., display housing) and a housing component 102b (e.g., base). The housing components 102a and 102b may be rotationally coupled together, thus allowing relative rotational movement between housing components 102a and 102b. As shown, housing component 102a carries a display 104 designed to present visual information (e.g., textual information, still images, video images, or a combination thereof), while housing component 102b carries an input mechanism 106a (e.g., track pad) and an input mechanism 106b (e.g., keyboard).

Additionally, electronic device 100 may include processing circuitry connected (e.g., electrically connected) to display 104 and input mechanisms 106a and 106b. In this regard, electronic device 100 may include a heat-generating component 108 that takes the form of processing circuitry, which may include a central processing unit, a graphics processing unit, one or more microcontrollers, one or more micro electromechanical system (MEMS) controllers, an application-specific integrated circuit, or a combination thereof. Electronic device 100 may further include a circuit board 110 on which heat-generating component 108 is located. In order to draw heat away from heat-generating component 108, electronic device 100 may further include a thermal module 120 (representing one or more thermal modules) that is thermally coupled to heat-generating component 108. In some examples, thermal module 120 is a heat pipe. Alternatively, in some examples, thermal module 120 is a vapor chamber. Electronic device 100 may include a combination of a heat pipe(s) and a vapor chamber(s). Thermal module 120 is designed to transport heat generated by heat-generating component 108 to another location within electronic device 100, where the transported heat can be dissipated and/or expelled from electronic device 100. For example, electronic device 100 may include a fin stack (not shown in FIG. 1) thermally coupled to thermal module 120, with the fin stack designed to remove heat from thermal module 120. Also, although not expressly shown, electronic device 100 may include one or more additional thermal modules with similar or different shapes and sizes, as compared to thermal module 120.

Figure 2:
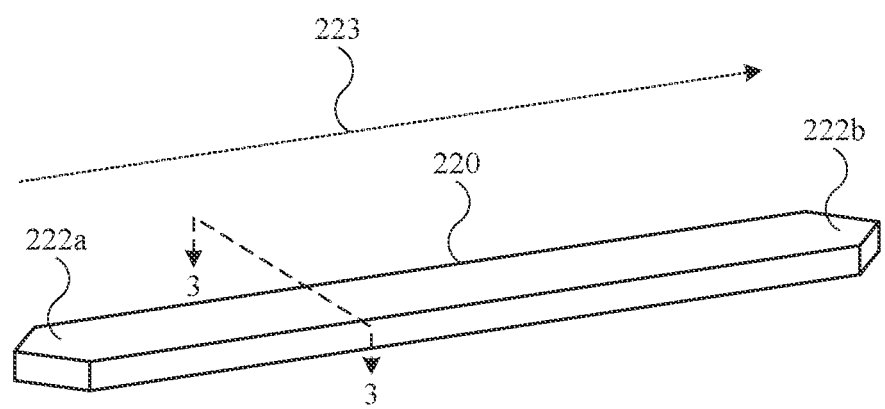
FIG. 2 illustrates a perspective view of an example of a thermal module, in accordance with aspect of the present disclosure.

Referring to FIG. 2, a thermal module 220 is shown. Thermal module 220 may include multiple parts (e.g., multiple housing parts) that couple together. Also, thermal module 220 may include an end 222a and an end 222b opposite end 222a. When thermal module 220 is thermally coupled and placed within proximity to a heat-generating component (not shown in FIG. 2) at end 222a, the heat received at end 222a can be transported (in a general direction of an arrow 223) to end 222b, where the heat is removed from thermal module 220 at or near end 222b. In this regard, end 222a and end 222b may be characterized as an evaporator region and a condenser region, respectively.

Figure 3:
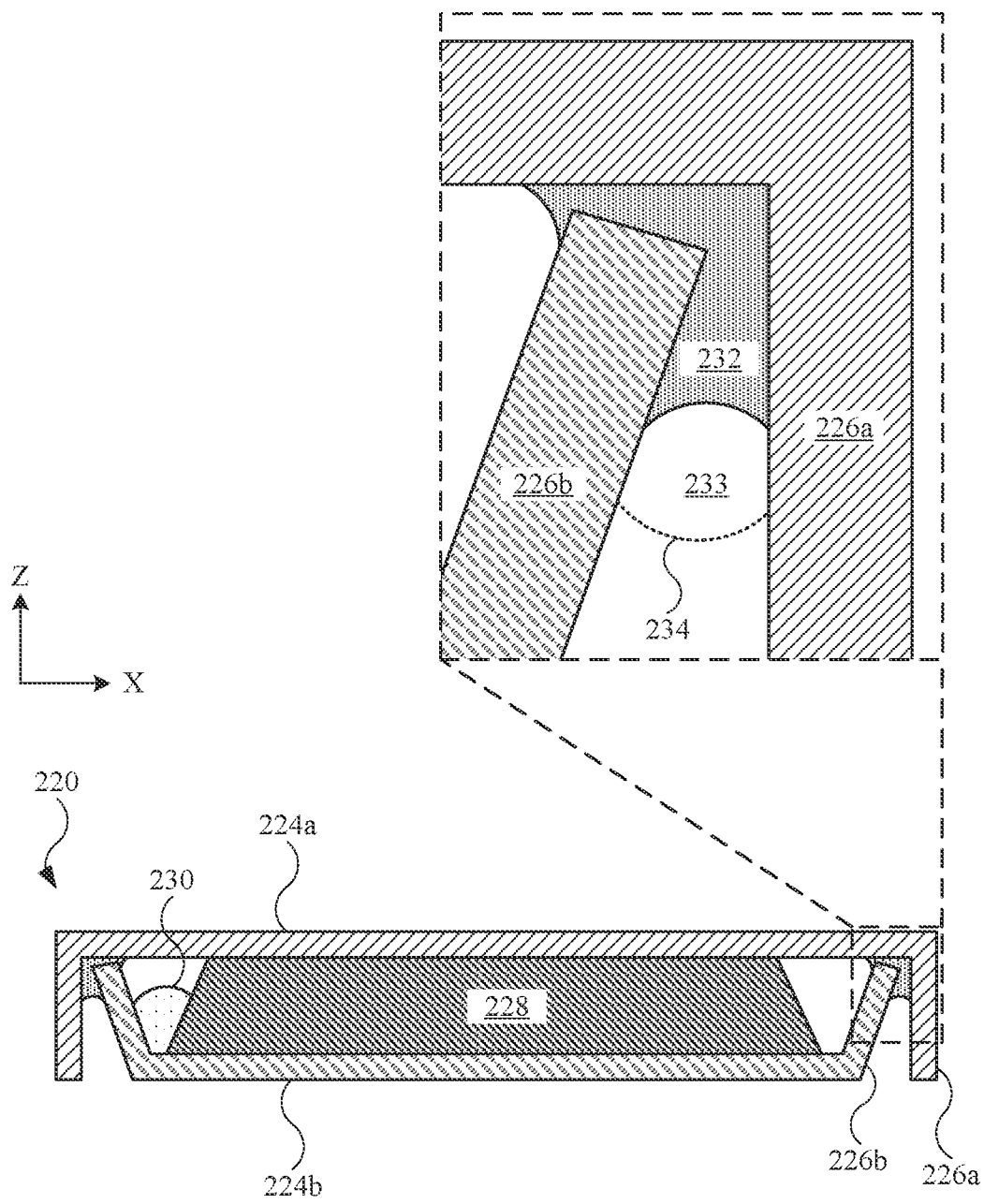
FIG. 3 illustrates a cross sectional view of a thermal module, in accordance with aspect of the present disclosure.

Referring to FIG. 3, a cross sectional view of thermal module 220 is shown. Thermal module 220 may include a part 224a and a part 224b coupled to part 224a. Based on their relative positions, part 224a and part 224b may be referred to as a top (or upper) part and a bottom (or lower) part, respectively. Each of parts 224a and 224b may include a metal (or metals) having a relatively high thermal conductivity. As non-limiting examples, each of parts 224a and 224b may include copper or a copper alloy. Also, each of parts 224a and 224b may include one or more walls. For example, part 224a and part 224b include a wall 226a and a wall 226b, respectively. Each of walls 226a and 226b may represent a side wall extending from a major wall, with the major wall representing a wall of greatest area of the parts 224a and 224b. Further, based on their relative positions, wall 226a and wall 226b may be referred to as an exterior (or external) wall and an interior (or internal) wall, respectively, as wall 226a is external to and generally covers wall 226b.

Thermal modules described herein may include one or more wick structures. For example, thermal module 220 may include a wick structure 228. In some examples, wick structure 228 includes a sintered, porous structure. Subsequent to a refrigerant 230 (e.g., water), in gas (or vapor) form, carrying thermal energy to a condenser region (not shown in FIG. 3), wick structure 228 designed to transport, using capillary forces, refrigerant 230, in a liquid state, from the condenser region to an evaporator region.

As shown in the enlarged view, walls 226a and 226b may be secured together by a bonding paste 232, or bonding material. In some examples, bonding paste 232 includes a solder paste, a copper paste, or a brazing paste. Other materials or substances (e.g., adhesives) may be selected. Thermally cured adhesives can behave in a similar way as a solder or brazing paste. For example, an epoxy adhesive that is cured with a baking process will undergo an initial decrease in viscosity as its temperature is elevated, at which point it can easily wick into the root of the divergent gap between the walls and form a meniscus there. After a time, the epoxy will set and become a solid body in the gap, thereby forming a mechanical joint and a hermetic seal in a controlled location between the two parts. Such adhesives may not be suitable for a thermal module, as their glass transition temperature will typically be in a range that will cause them to soften when subjected to heat produced at the evaporator zone. However, adhesive joints in non-thermal applications can be used as conjunction with the divergent wall concept described herein to hermetically join parts. By securing walls 226a and 226b together, bonding paste 232 may secure parts 224a and 224b together. Moreover, bonding paste 232 may extend along, and fill, a gap 233 (e.g., location) between walls 226a and 226b. In this regard, bonding paste 232 may provide a joint (e.g., structural joint) between walls 226a and 226b. Moreover, bonding paste 232 may provide a hermetic seal (e.g., where gap 233 is filled by bonding paste 232), thus keeping air and liquids out of thermal module 220, and keeping refrigerant 230 within thermal module 220.

Also, the walls 226a and 226b may be characterized as divergent walls. For example, while wall 226a is generally a vertical wall (extending along a Z-axis in Cartesian coordinates) forming a 90-degree angle (e.g., right angle) with another wall of part 224a, wall 226b is formed an angle 234 with respect to wall 226a. Accordingly, the respective directions represented by the position of walls 226a and 226b may intersect. Put another way, walls 226a and 226b are non-parallel with respect to each other. Angle 234 may be approximately in the range of 10-30 degrees. Accordingly, angle 234 is a non-zero angle. As shown in FIG. 3, angle 234 is 20 degrees (or approximately 20 degrees). The divergent relationship between may walls 226a and 226b may exist each location of walls 226a and 226b, thus providing the divergence around a perimeter of thermal module 220. Also, the distance between walls 226a and 226b may be continually increasing from the "root" of the divergence, or location in which walls 226a and 226b are the closest (or approximately the closest) to each other, to the exterior of the enclosure defined by the parts 224a and 224b. Also, walls 226a and 226b may be angled so long as walls 226a and 226b have different angles, thus causing a relative divergence.

Using multiple parts (e.g., parts 224a and 224b) for a thermal module (e.g., thermal module 220) may provide several advantages. For example, each of parts 224a and 224b can be formed (e.g., stamped, bent, or otherwise modified) into their respective final shapes prior to being bonded together by bonding paste 232. Wick structure 228 can be added to part 224a and/or part 224b, respectively, after the forming operations of parts 224a and 224b. Beneficially, and unlike traditional thermal modules, wick structure 228 is not subject to external loads or other stresses caused during the formation operations of parts 224a and 224b, and are less likely to become damaged, thus allowing thermal module 220 to provide its intended heat transportation functions.

Figure 4A:
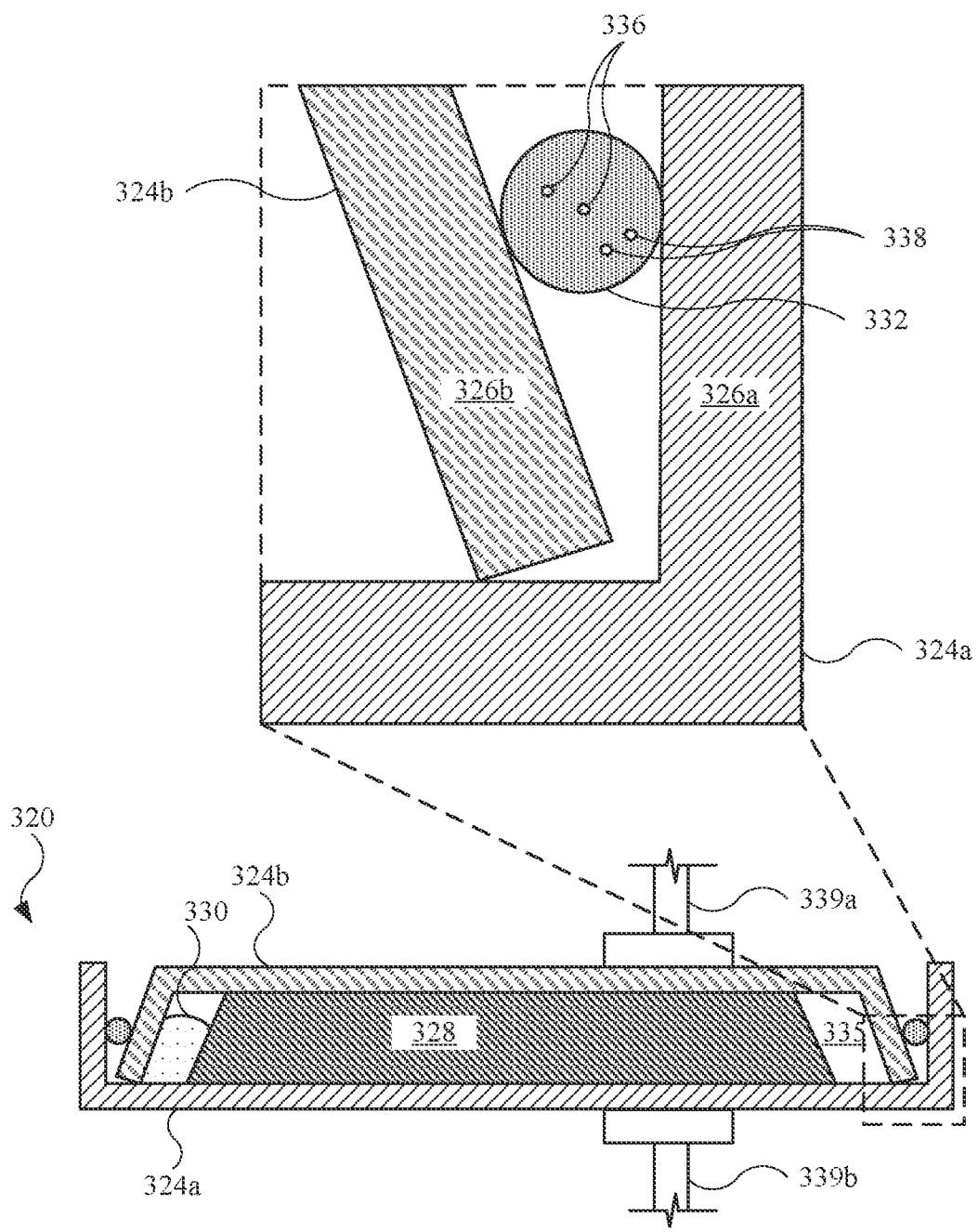
FIGS. 4A, 4B, and 4C illustrate a process for joining two housing parts of a thermal module together, in accordance with aspect of the present disclosure.
Figure 4B:
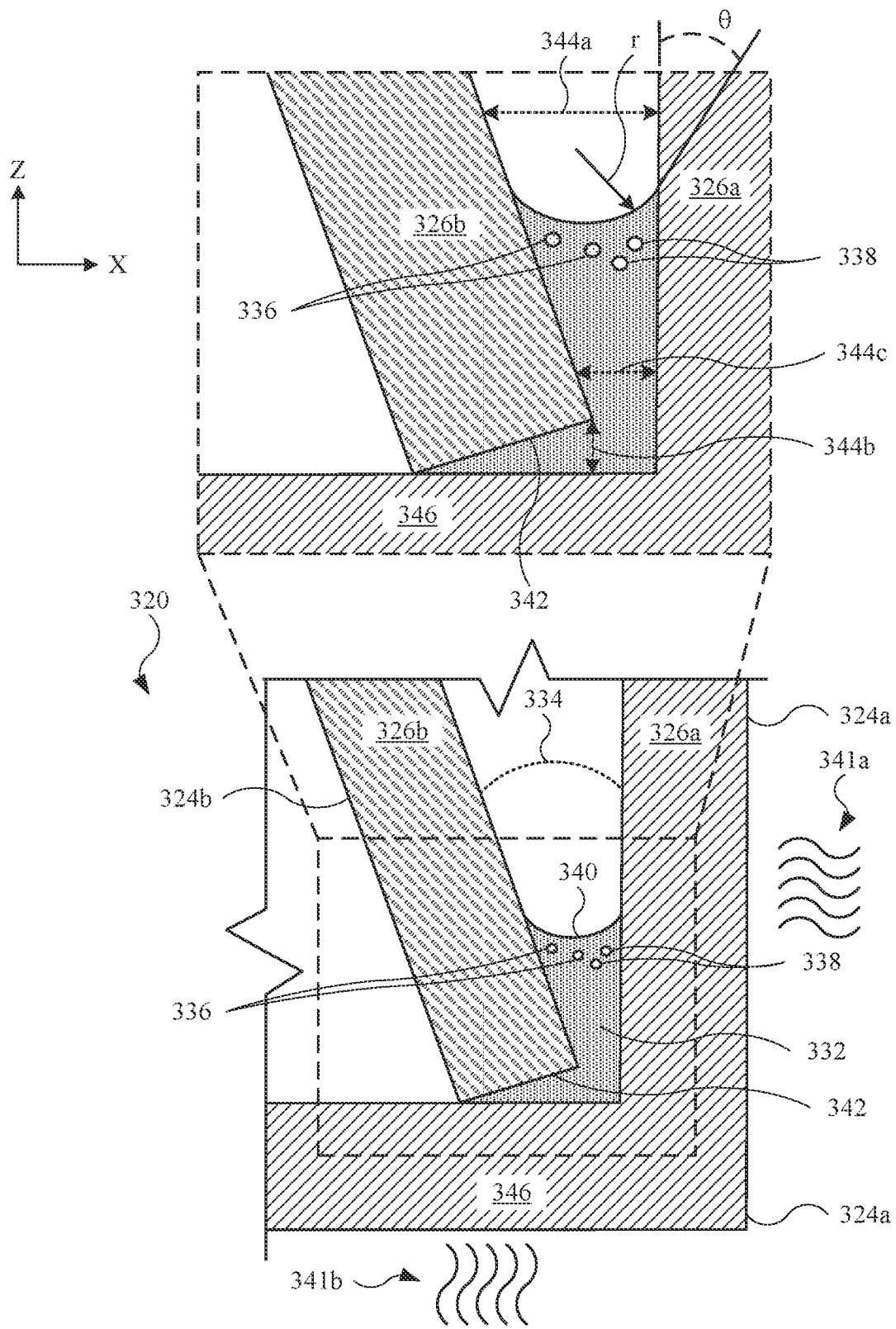
Figure 4C:
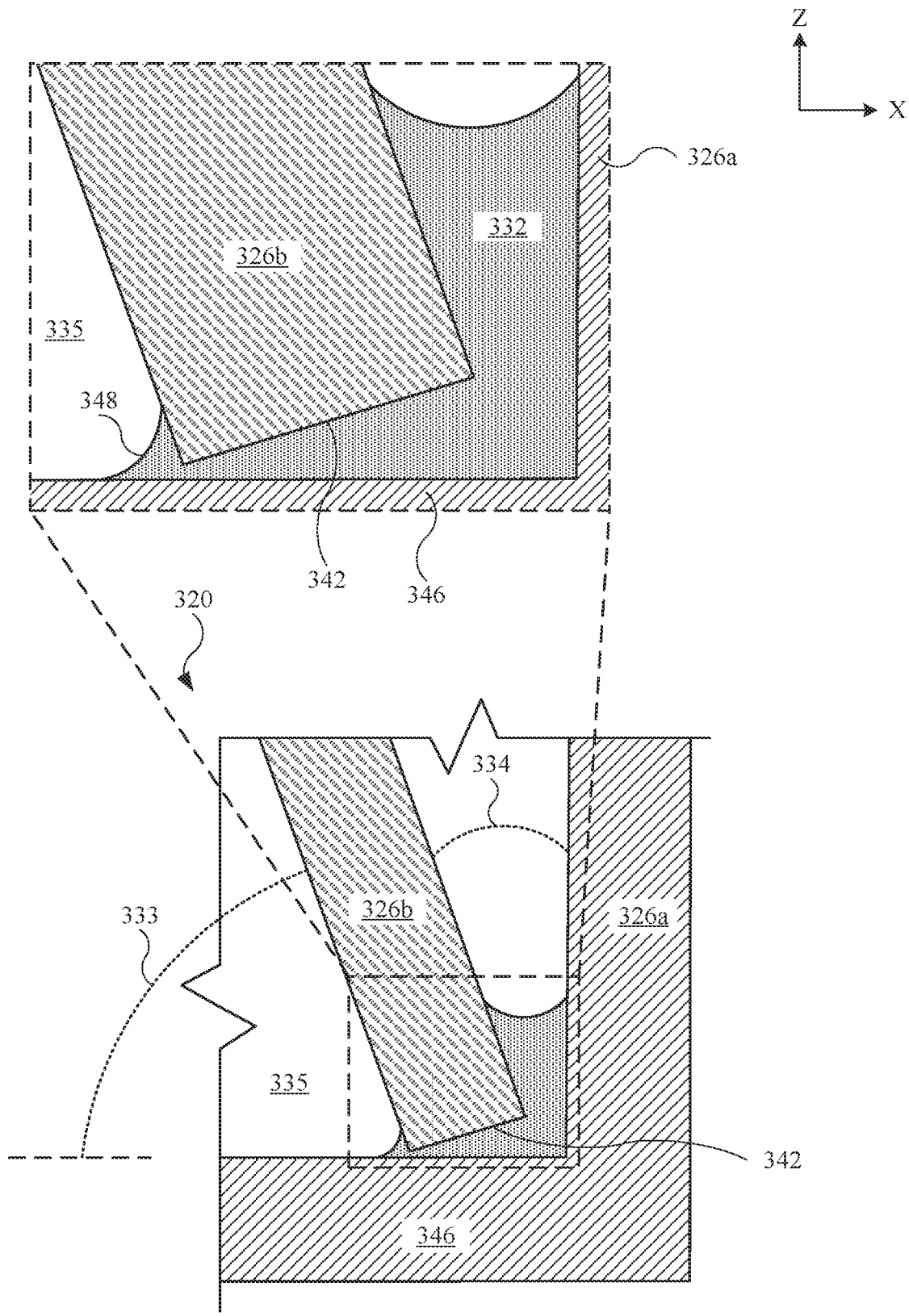

FIGS. 4A, 4B, and 4C show a process for providing and controlling a bonding paste 332 between respective walls of two parts of a thermal module 320. As shown, during the application of bonding paste 332, thermal module 320 may be rotated 180 degrees (i.e., turned upside down) to maintain bonding paste 332 between a wall 326a and a wall 326b of a part 324a and a part 324b, respectively, of thermal module 320. Also, thermal module 320 may include any features and/or characteristics for a thermal module shown and described herein.

Referring to FIG. 4A, thermal module 320 includes a part 324a and a part 324b. Thermal module 320 may form an internal volume 335, representing an interior space or void. Part 324a may be characterized as defining internal volume 335, and part 324b may be positioned, or disposed in internal volume 335 as shown in FIG. 4A. Also, internal volume 335 may provide a location for a wick structure 328 and a refrigerant 330. Further, as shown, bonding paste 332 is in a solid state (e.g., non-melted form as a bond wire) and is positioned between a wall 326a (of part 324b) and a wall 326b (of part 324b). As shown in the enlarged view, bonding paste 332 may include some particles, air, or other impurities. For example, bonding paste 332 may include droplets 336 (representative of additional impurity particles or droplets), each of which may take the form of soldering flux. Additionally, bonding paste 332 may include air bubbles 338 (representative of additional bubbles). Also, in order to maintain parts 324a and 324b together during assembly and to limit or prevent bonding paste 332, during reflow (e.g., in an oven), from entering internal volume 335, a clamp 339a and a clamp 339b (or a weight fixture) may apply a force that holds parts 324a and 324b, respectively, together. When bonding paste 332 takes the form of copper paste, the copper paste may include copper particles that remain solid through the melting process. The copper particles are not intended to be purged out, based in part on their relatively high density.

Referring to FIG. 4B, thermal module 320 is placed in a heating apparatus (e.g., an oven or brazing furnace) and is heated (denoted by lines 341a and lines 341b), causing reflow of bonding paste 332. As shown, walls 326a and 326b are diverging walls that are separated by an angle 334, which may be approximately in the range of 10-30 degrees. As shown in FIG. 4, angle 334 is 20 degrees, or approximately 20 degrees.

Bonding paste 332, in a molten (e.g., liquid) state, may move between walls 326a and 326b based on gravitational forces. Further, based on walls 326a and 326b forming diverging walls, capillary attraction forces in the form of capillary pressure can further draw bonding paste 332 between walls 326a and 326b, causing a meniscus 340 (e.g., concave meniscus) in bonding paste 332. The capillary pressure, $P_c$, within bonding paste 332 is governed by $$P_c = \frac{2\sigma \mathrm{Cos}\theta}{r} \quad \text{Eq. 1}$$

where σ is the interfacial (or surface) tension between bonding paste 332 in molten state and air (e.g., ambient air) in contact with bonding paste 332, θ is the contact angle of bonding paste 332 in molten state, and r is the radius of curvature of the molten meniscus surface. As shown in FIG. 4B, a gap 344a (e.g., distance or separation) between walls 326a and 326b along the X-direction reduces in the negative Z-direction. Accordingly, based on Eq. 1, the capillary pressure $P_c$ and surface tension in the meniscus surface create a capillary rise effect in the positive Z direction, resulting in a pressure gradient within bonding paste 332 in molten state. The forces acting on or in bonding paste 332 in molten state cause bonding paste 332 to settle between walls 326a and 326b, even as the gap or space between walls 326a and 326b become smaller. Further, a gap 344b (e.g., distance or separation) between an end surface 342 (root of the divergence) of wall 326b and a wall 346 (e.g., major wall) of part 324a represents additional divergence, as gap 344b along the Z-direction reduces in the negative X-direction. The additional divergence may further increase capillary pressure along the negative X-direction. Beneficially, bonding paste 332, in molten state, is further drawn into spaces between parts 324a and 324b, thereby causing bonding paste 332 to attach to multiple different surfaces and structures of parts 324a and 324b, thus increasing the joint provided by bonding paste 332 to parts 324a and 324b. Additionally, a gap 344c, representing an additional gap between walls 326a and 326c, may include a different dimension than that of gap 344a. As shown, gap 344b is less than gap 344a (in terms of a one-dimensional distance), and gap 344c is equal to or larger than gap 344b such that, collectively, the gap is continuously growing from the closest point between parts 224a and 224b (including their respective walls) to the location of the meniscus. In this regard, the divergence described between parts 224a and 224b (in particular, their respective walls) may include an increasing gap in the positive X-direction and further increasing in the positive Z-direction. Also, bonding paste 332 may provide a capillary seal that isolates pressure within internal volume 335 from ambient air pressure surrounding thermal module 320.

Additionally, in order to improve bonding and sealing capabilities of bonding paste 332, droplets 336 (e.g., soldering or brazing flux), air bubbles 338, and other impurities should be removed from bonding paste 332 such that bonding paste 332 provides a homogeneous structure. In this regard, egress of droplets 336 and air bubbles 338 may occur while bonding paste 332 is in its molten/liquid state. The velocity v of a substance rising within bonding paste 332 (in molten state) is governed by Stoke's Law:

$$v = \frac{2(\rho_p - \rho_f)gr^2}{9\mu} \quad \text{Eq. 2}$$

where $\rho_p$ is the density of an particle or impurity (e.g., droplets 336 in liquid form or air bubbles 338) in bonding paste 332, $\rho_f$ the density of the fluid (e.g. bonding paste 332 in molten state), g is gravitational force, r is the spherical radius of the particle or impurity (e.g., droplets 336 or air bubble 338), and μ is the dynamic viscosity of bonding paste 332 in molten state. The dynamic viscosity μ of bonding paste 332 is known to decrease with increasing temperature. Thus, according to Eq. 2, the velocity v of droplets 336 or air bubbles 338 within bonding paste 332 increases with increasing temperature of bonding paste 332 in molten state. Additionally, the absolute value of the velocity, v, increases as the difference between density $\rho_f$ of bonding paste 332 in molten state increases relative to the density $\rho_p$ of the particle. Accordingly, selecting bonding paste 332 with a relatively high density can also increase velocity v. By increasing velocity v by increasing applied temperature to bonding paste 332 and/or decreasing viscosity u of bonding paste 332, particles within bonding paste 332 may experience greater buoyancy, leading to not only an increased likelihood of egress (resulting in greater homogeneity of bonding paste 332) but also faster egress (resulting in less manufacturing time). It should be noted that air bubbles, flux droplets, impurity particles, etc. are, individually, of lower density as compared to that of bonding paste 332 in order to egress the air bubbles, flux droplets, impurity particles, respectively, to the surface of meniscus 340. Also, with increasing temperature, thermal expansion of air bubbles may increase radius r and decrease particle density $\rho_p$, thus further compounding the effects that increase their egress velocity v.

Referring to FIG. 4C, thermal module 320 is removed from the heating apparatus, and bonding paste 332 freezes (i.e., the temperature of bonding paste 332 falls below its melting point). The capillary pressure may cause bonding paste 332 to extend between end surface 342 of wall 326b and wall 346 (e.g., major wall), and into internal volume 335, particularly during instances of a relatively small gap between walls 326b and 346. For example, as shown in the enlarged view, bonding paste 332 may enter internal volume 335 and also form a meniscus 348 (e.g., concave meniscus). However, due to clamps 339a and 339b (both shown in FIG. 4A), bonding paste 332 within internal volume 335 may be limited such that bonding paste 332 does not contact a wick structure (e.g., wick structure 328 shown in FIG. 4A). Also, angle 334 between walls 326a and 326b can be adjusted to influence capillary rise in bonding paste 332 in molten state so as to regulate movement of bonding paste 332 within internal volume 335. Additionally, an angle 333 between walls 346 and 326b is the compliment of angle 334, resulting in angle 333 being larger (e.g., multiple orders of magnitude) than angle 334. Angle 333 may cause a meniscus 348 with the same radius of curvature and the same contact angle as that of radius of curvature r and contact angle θ, respectively, (shown in FIG. 4B) to form internal to the nearest point between the two parts since the capillary pressure gradient is the same at both menisci. Therefore, the body of bonding paste 332 that forms internally with respect to the nearest point between the two structures (e.g., wall 326b and wall 346) is self-limiting and relatively small, reducing the risk that bonding paste 332 can reach an internal wick structure (e.g., wick structure 328 shown in FIG. 4A). Further, droplets 336 and air bubbles 338 (shown in FIGS. 4A and 4B) egress from bonding paste 332. Beneficially, by removing droplets 336 and air bubbles 338, bonding paste 332 is a homogenous structure, thus increasing the joint strength and seal hermeticity capabilities of bonding paste 332 after bonding paste 332 has frozen into a solid body.

FIGS. 5-14 show and describe alternate examples of thermal modules. The thermal modules shown and described in FIGS. 5-14 may include any features shown and/or described herein, and may provide modifications to prior examples of thermal modules.

Figure 5:
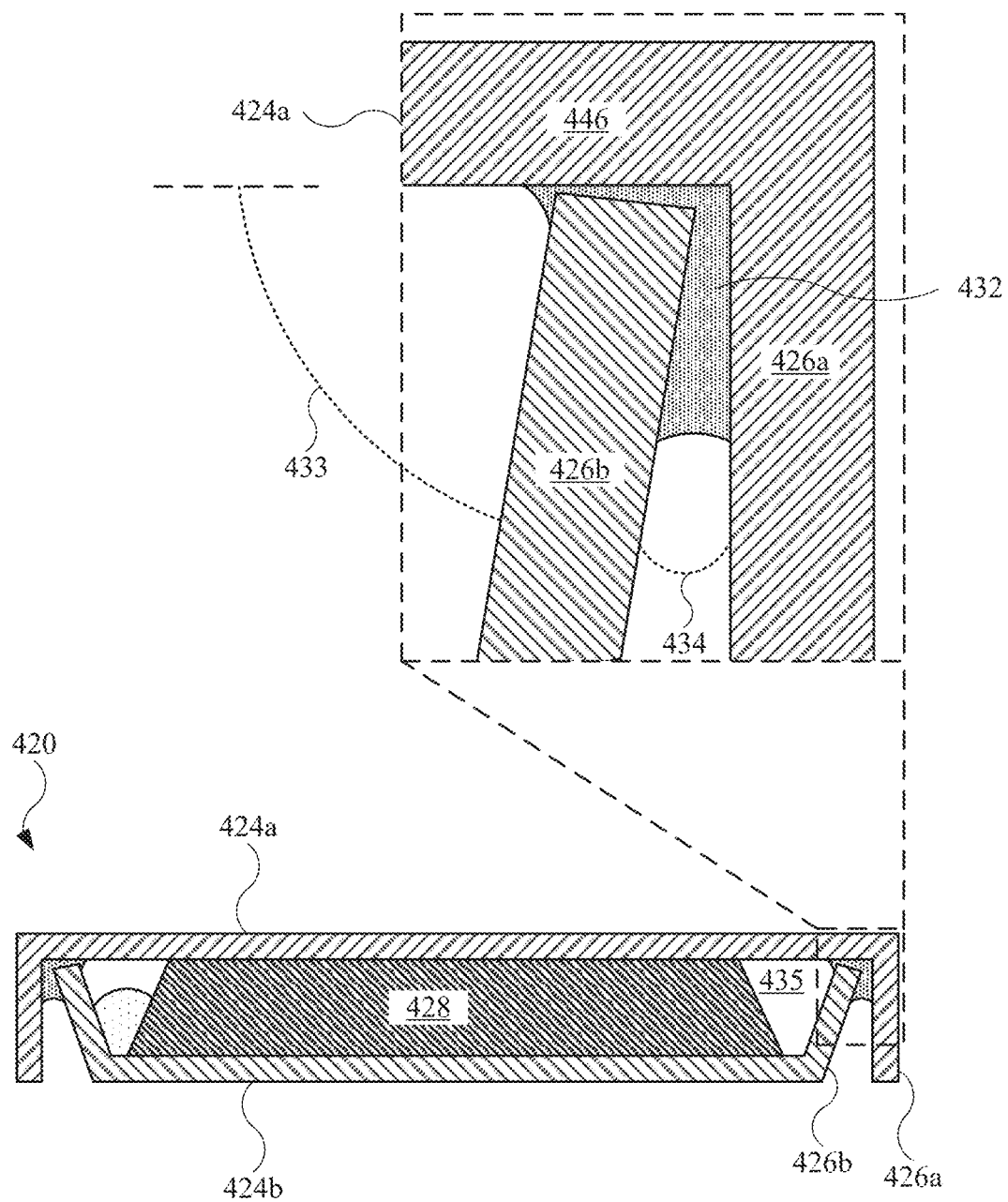
FIG. 5 illustrates a cross sectional view of a thermal module, showing the walls of the housing parts diverging at a different angle, in accordance with aspect of the present disclosure.

Referring to FIG. 5, a thermal module 420 includes a part 424 a with a wall 426 a, as well as a part 424 b with a wall 426 b. A bonding paste 432 forms a joint and a hermetic seal between walls 426 a and 426 b. As shown in the enlarged view, walls 426 a and 426 b are diverging walls and are separated by an angle 434. As shown, angle 434 is 10 degrees (or approximately 10 degrees). Based on angle 434 being relatively smaller as compared to a prior example, walls 426 a and 426 b are closer together. Also, angle 434 between walls 426 a and 426 b can be adjusted to influence capillary rise in bonding paste 432 in molten state so as to regulate movement of bonding paste 432 into internal volume 435. Additionally, an angle 433 between walls 426 a and 426 b is the compliment of angle 434, resulting in angle 433 being larger than angle 434. Similar to a prior example, the body of bonding paste 432 that forms internally with respect to the nearest point between the two structures (e.g., part 426 b and wall 446) is self-limiting and relatively small, reducing the risk that bonding paste 432 can reach a wick structure 428. Further, droplets and/or air bubbles (not shown in FIG. 5) egress from bonding paste 432. Beneficially, by removing droplets and air bubbles, bonding paste 432 is a homogenous structure, thus increasing the joint strength and seal hermeticity capabilities of bonding paste 432 after bonding paste 432 has frozen into a solid body. It should be noted that if the wall thickness of wall 426 b is not uniform, then angle 433 will not be the exact compliment of angle 434. However, parts 424 a and 424 b may still be designed such that angle 433 is substantially larger than angle 434. Alternatively, in some examples, both angles 433 and 434 are equal, in which case two nearly identical columns of molten solder (e.g., bonding paste 432) form similarly in each of the divergent wall clearances (e.g., between walls 426 a and 426 b) and thus achieve a similar means of hermetically sealing a structural joint.

Figure 6:
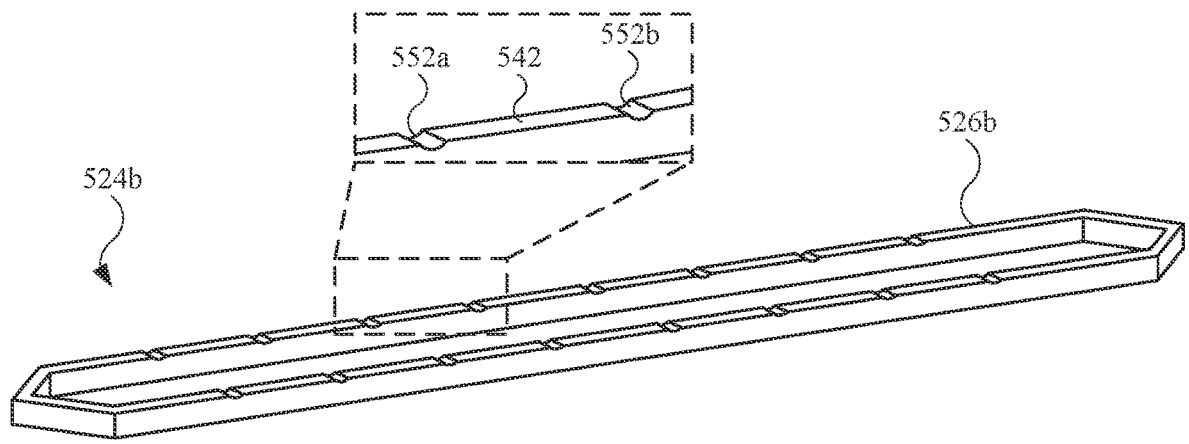
FIG. 6 illustrates a perspective view of a housing part of a thermal module modified to include several openings along a surface of a wall, in accordance with aspect of the present disclosure.

Referring to FIG. 6, a part 524b of a thermal module includes several openings. For example, part 524b includes a wall 526b with several openings, such as an opening 552a and an opening 552b (representative of several additional openings throughout wall 526b) formed on an end surface 542 of wall 526b. Thus, the part 524b may be referred to as a scalloped part. While a discrete number of openings are shown distributed along the edges of wall 526b, the number of openings may vary.

Figure 7:
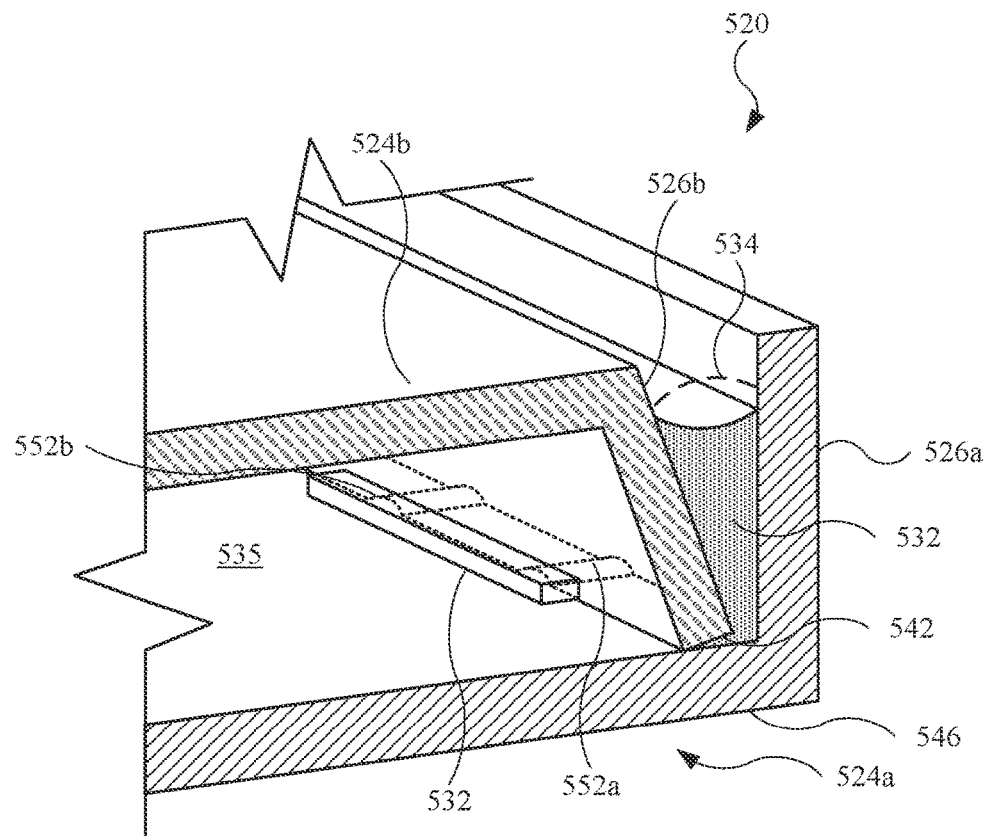
FIG. 7 illustrates an enlarged perspective partial cross sectional view of housing parts of a thermal module joined together, with one of the walls having openings, in accordance with aspect of the present disclosure.

Referring to FIG. 7, part 524b is coupled with a part 524a to form a thermal module 520. Part 524a may include a wall 526a, with walls 526a and 526b forming diverging gap with an angle 534 between walls 526a and 526b. End surface 542 of wall 526b is positioned at a similar angle, as that of angle 534, with respect to a wall 546 of part 524a. In one embodiment, bonding paste 532 is applied at the corner of walls 546 and 526a before installation of inner part 542b. This results in some portion of the bonding paste 532 being squeezed to the inside of wall 526b and end surface 542 of wall 526b during the assembly of parts 524a and 524b. Once heated to a molten state, bonding paste 532 may be drawn through openings 552a and 552b (as well as other openings in wall 526b) by wicking forces, or capillary forces, such that at least some of bonding paste 532 passes across wall 526b and out of internal volume 535 between parts 524a and 524b.

Figure 8:
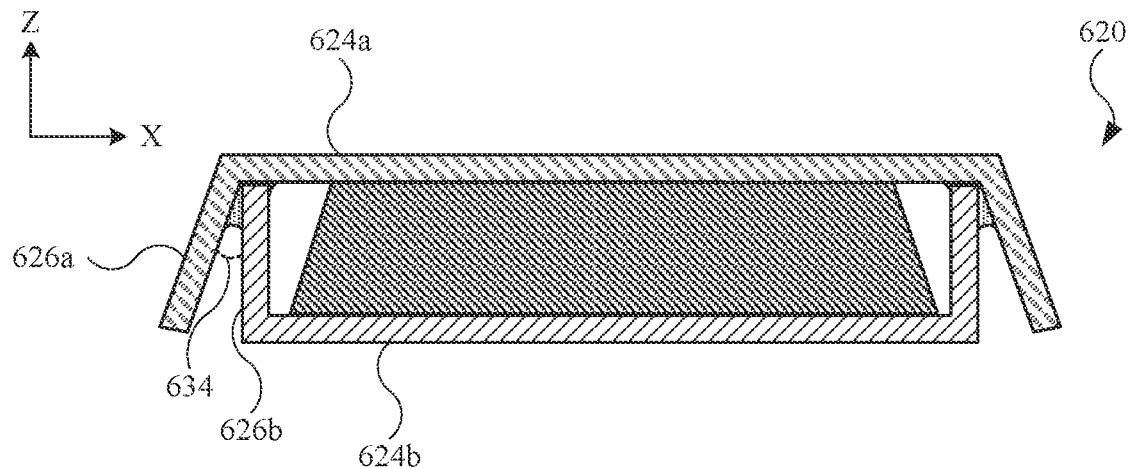
FIGS. 8-10 illustrate cross sectional views of alternate examples of a thermal module, in accordance with aspect of the present disclosure.

Referring to FIG. 8, a thermal module 620 is shown with a part 624a and a part 624b having a wall 626a and a wall 626b, respectively. As shown, walls 626a and 626b may be characterized as diverging walls. Wall 626b (an interior wall) is generally a vertical wall (extending along a Z-axis) formed at a 90-degree angle with respect to another wall of part 624b. However, wall 626a (an exterior wall) is an at angle 634 (e.g., non-zero angle) with respect to wall 626b. Thus, wall 626a, representing an external or exterior wall, of part 624a may provide a wall that causes divergence between walls 626a and 626b.

Figure 9:
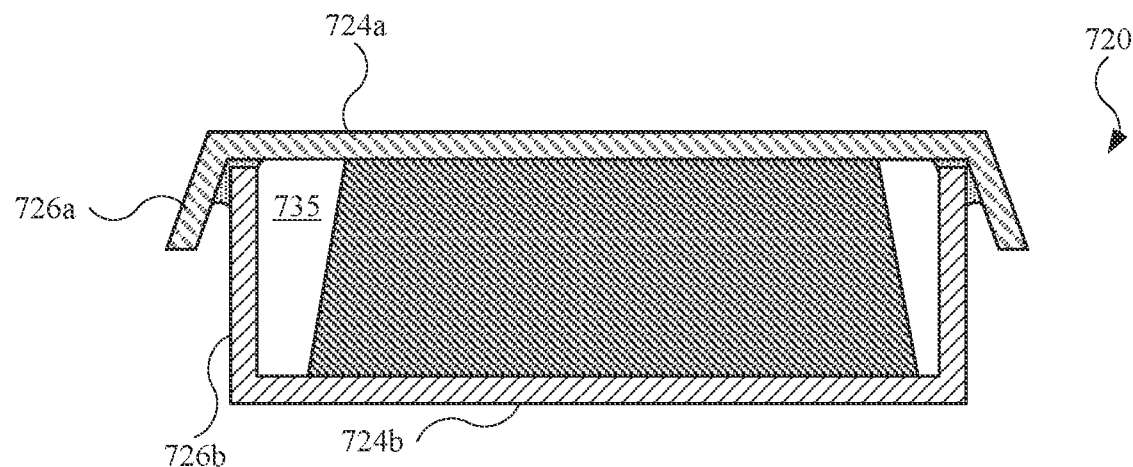

Referring to FIG. 9, a thermal module 720 is shown with a part 724a and a part 724b having a wall 726a and a wall 726b, respectively. As shown, walls 726a and 726b may be characterized as diverging walls. However, walls 726a and 726b may include different lengths. For example, wall 726b is longer than wall 726a. As a result, wall 726b may provide a larger internal volume 735 for thermal module 720, while wall 726a is shorter to save on materials.

Figure 10:
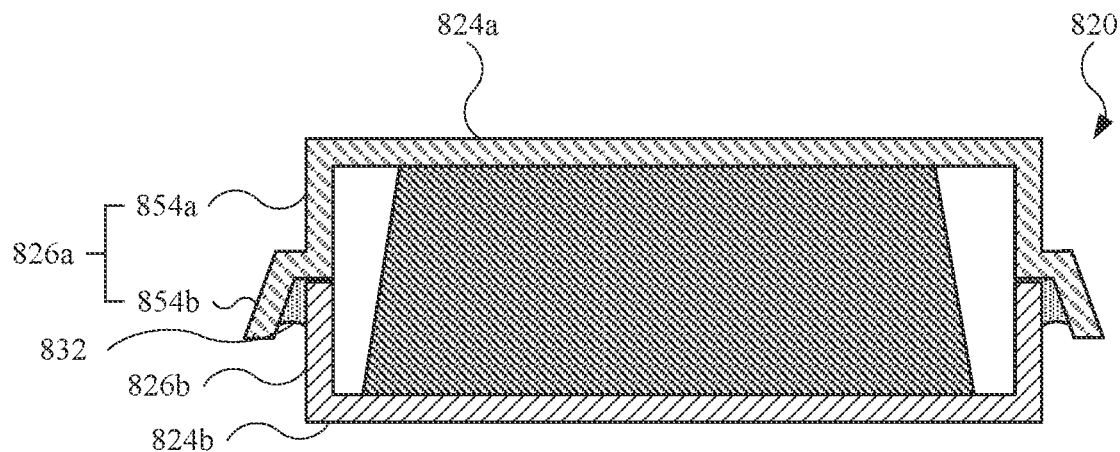

Referring to FIG. 10, a thermal module 820 is shown with a part 824a and a part 824b having a wall 826a and a wall 826b, respectively. As shown, walls 826a and 826b may be characterized as diverging walls. However, wall 826a may be modified to provide a straight portion 854a (aligned with wall 826b) and a divergent portion 854b. Based on divergent portion 854b of wall 826b, wall 826a and 826b are diverging walls, thus providing a location for a bonding paste 832.

Figure 11:
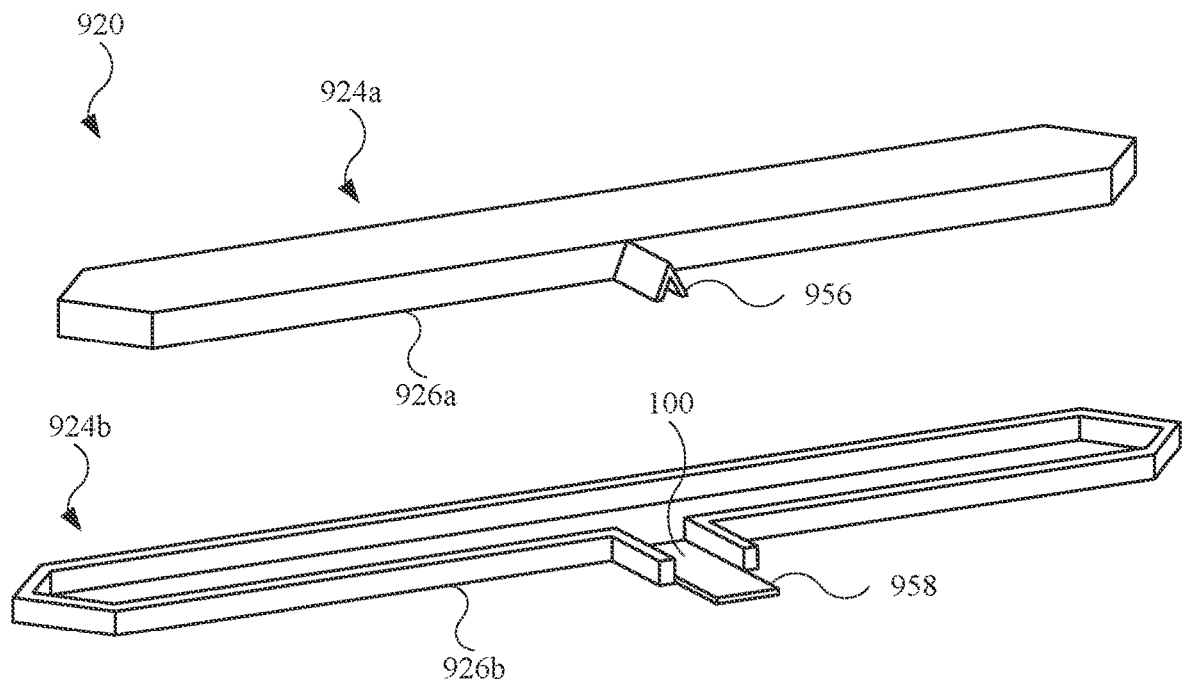
FIGS. 11 and 12 illustrate an alternate example of a thermal module, showing a port used to receive a refrigerant, in accordance with aspect of the present disclosure.

Referring to FIG. 11, a thermal module 920 is shown with a part 924a and a part 924b having a wall 926a and a wall 926b, respectively. The gap formed between walls 926a and 926b is divergent due to walls 926a and 926b being formed with different angles as described in previous embodiments. A wick structure (not shown) is placed between parts 924a and 924b prior to assembly. As described herein, parts 924a and 924b can be combined by using a bonding paste (not shown in FIG. 11), which requires a heating operation to reflow the bonding paste. Afterward, a refrigerant (not shown in FIG. 11) is added into thermal module 920 after the heating operation. In order to provide the refrigerant, parts 924a and 924b can be modified to include an opening or fill port. For example, wall 926a may include a port 956 that provides an opening into the internal volume of thermal module 920 to provide a refrigerant. Further, wall 926b may include an extension 958, which can be modified (e.g., bent) to cover port 956, thus acting as a door.

Figure 12:
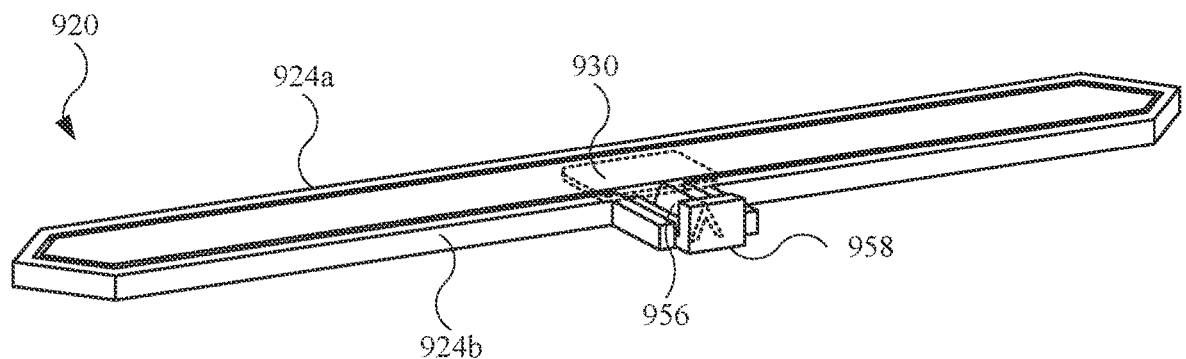

Referring to FIG. 12, parts 924a and 924b may be secured together by a bonding paste in a manner described herein. When a refrigerant 930 (shown as dotted lines) is added to thermal module 920 via port 956, port 956 can be closed by bending extension 958 to cover port 956 and retain refrigerant 930, as shown in FIG. 12. Port 956 can further be sealed by adding bonding paste (not shown in FIG. 12) to provide a seal between port 956 and extension 958. Alternatively, in some examples, port 956 can exclude extension 958 and use an alternate method of closure where a wire is partially inserted into port 956 and solder is melted into the gaps between said wire and port 956 to seal port 956 shut for the purpose of retaining the refrigerant.

Figure 13:
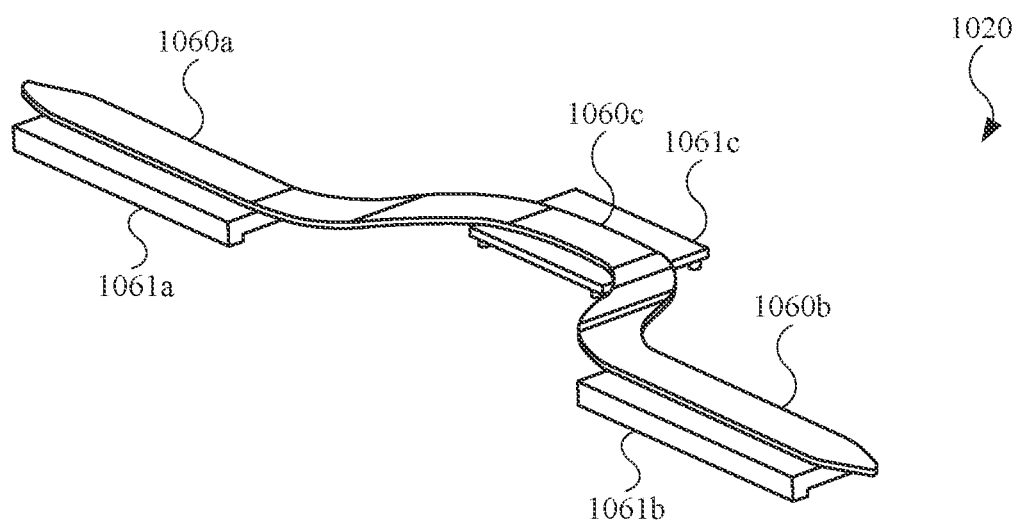
FIGS. 13 and 14 illustrate alternate examples of thermal modules having different shapes, in accordance with aspect of the present disclosure.

Referring to FIG. 13, a thermal module 1020 includes a body may extend in three dimensions. As shown, thermal module 1020 includes a portion 1060a and a portion 1060b, and further includes a portion 1060c representing an elevated or raised portion with respect to portions 1060a and 1060b. As shown, portions 1060a and 1060b are thermally coupled to a thermal component 1061a and a thermal component 1061b, respectively. In one or more implementations, each of thermal component 1061a and thermal component 1061b takes the form of a fin stack. Also, 1060c is thermally coupled to a thermal component 1061c. In one or more implementations, thermal component 1061c takes the form of a heat spreader. Based on portion 1060c being elevated/raised, thermal module 1020 may pass over one or more components of an electronic device, thus allowing thermal module 1020 to conform to a design layout of the electronic device.

Figure 14:
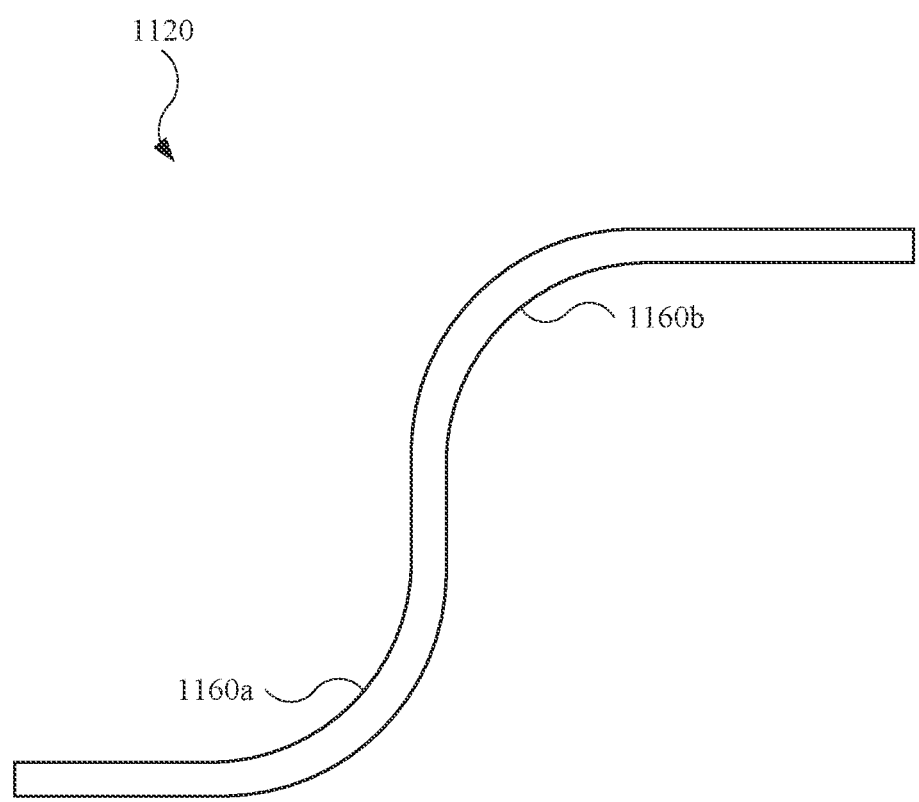

Referring to FIG. 14, a thermal module 1120 includes a body may extend in three dimensions. As shown, thermal module 1020 includes a portion 1160a and a portion 1160b, with portions 1160a and 1160b representing curved portions. Based on portion 1160a and 1160b being curved, thermal module 1120 may pass around one or more a components of an electronic device.

Figure 15A:
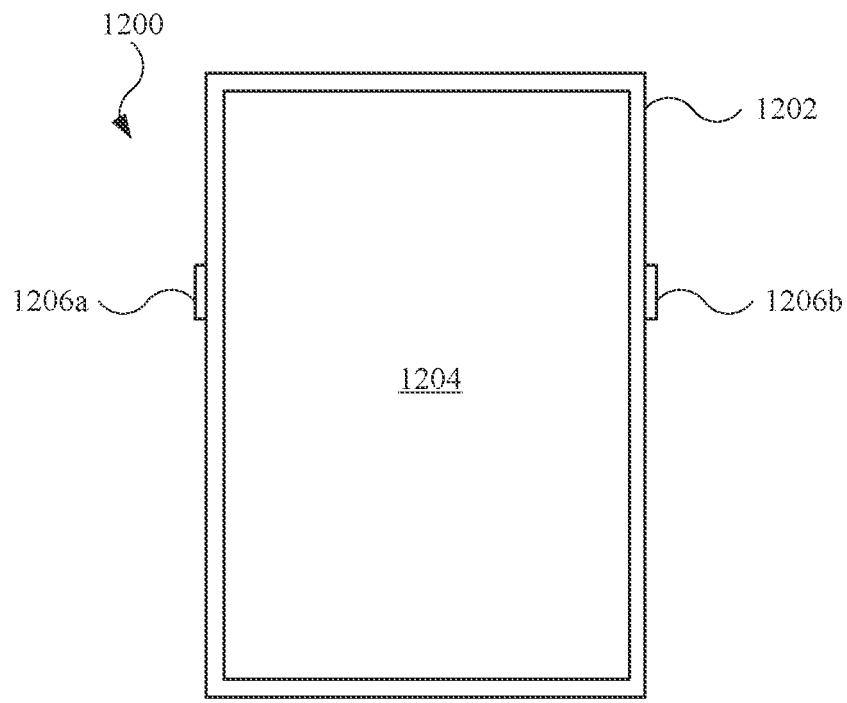
FIGS. 15A and 15B illustrate alternate examples of electronic devices that may include one or more thermal modules shown and described herein.
Figure 15B:
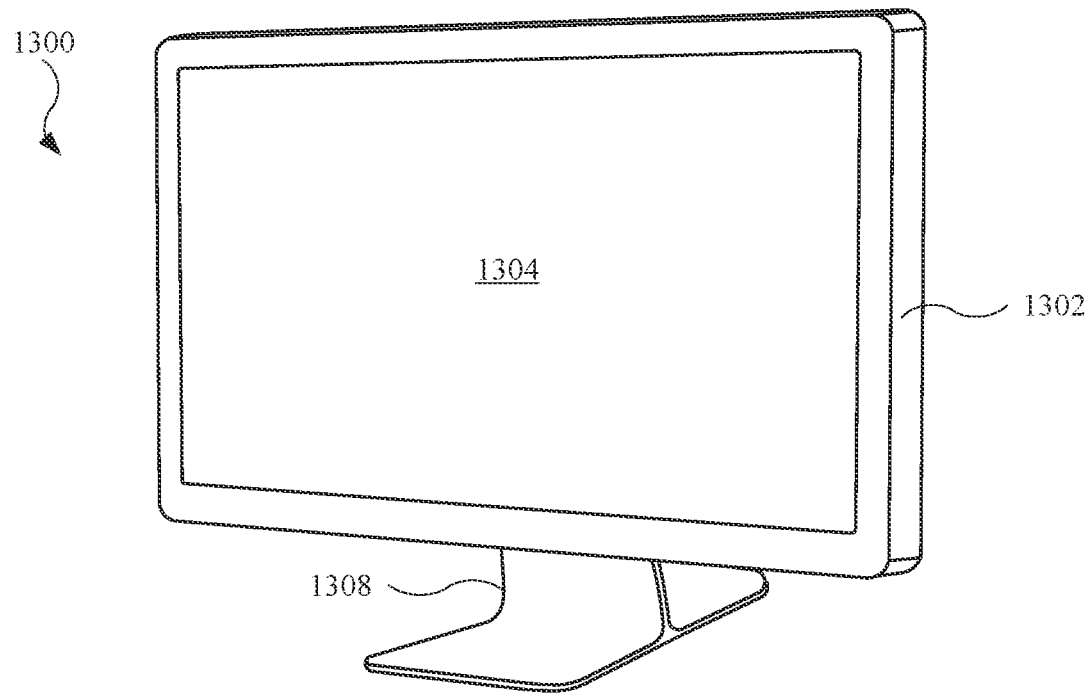

FIGS. 15A and 15B represent additional electronic device that may include one or more thermal modules shown and/or described herein. The electronic device shown and described in FIGS. 15A and 15B may include one or more heat-generating components, with one or more thermal modules shown and/or described herein that is/are thermally coupled to the one or more heat-generating components. Referring to FIG. 15A, an electronic device 1200 is shown. Electronic device 1200 may take the form of a mobile wireless communication device, such as a smartphone or a tablet computing device, as non-limiting examples.

As shown, electronic device 1200 includes a housing 1202 and a display 1204 coupled to housing 1202. Housing 1202 may include metal (including metal alloy), a transparent material (e.g., glass sapphire), or a combination thereof. Display 1204 is designed to present visual information, such as textual information, still images, or motion images (e.g., video). Further, display 1204 may include a capacitive touch sensitive layer, thus allowing display 1204 to receive touch inputs and/or gestures through interaction with display 1204.

Electronic device 1200 may further include one or more buttons. For example, electronic device 1200 included a button 1206a and a button 1206b, each of which can be depressed to provide an input to, for example, interact with and alter/update the visual information on display 1204. Although buttons 1206a and 1206b are shown in particular locations, buttons 1206a and 1206b may generally be positioned in other locations. Also, although buttons 1206a and 1206b represent a discrete number of buttons, electronic device 1200 may include a different number of buttons.

Referring to FIG. 15B, an electronic device 1300 takes the form of a desktop computing device or a standalone display.

Electronic device 1300 includes a housing 1302 (e.g., display housing) and a stand 1308. Housing 1302 and stand 1308 may be rotationally coupled together, thus allowing relative rotational movement between housing 1302 and stand 1308. As shown, housing 1302 carries a display 1304 designed to present visual information. Although not shown, processing circuitry can be electrically connected to display 1304 using circuits (e.g., flexible circuits).

Although not expressly shown, electronic devices may take the form of various electronic devices. As a non-limiting example, an electronic device may include a video streaming device.

Figure 16:
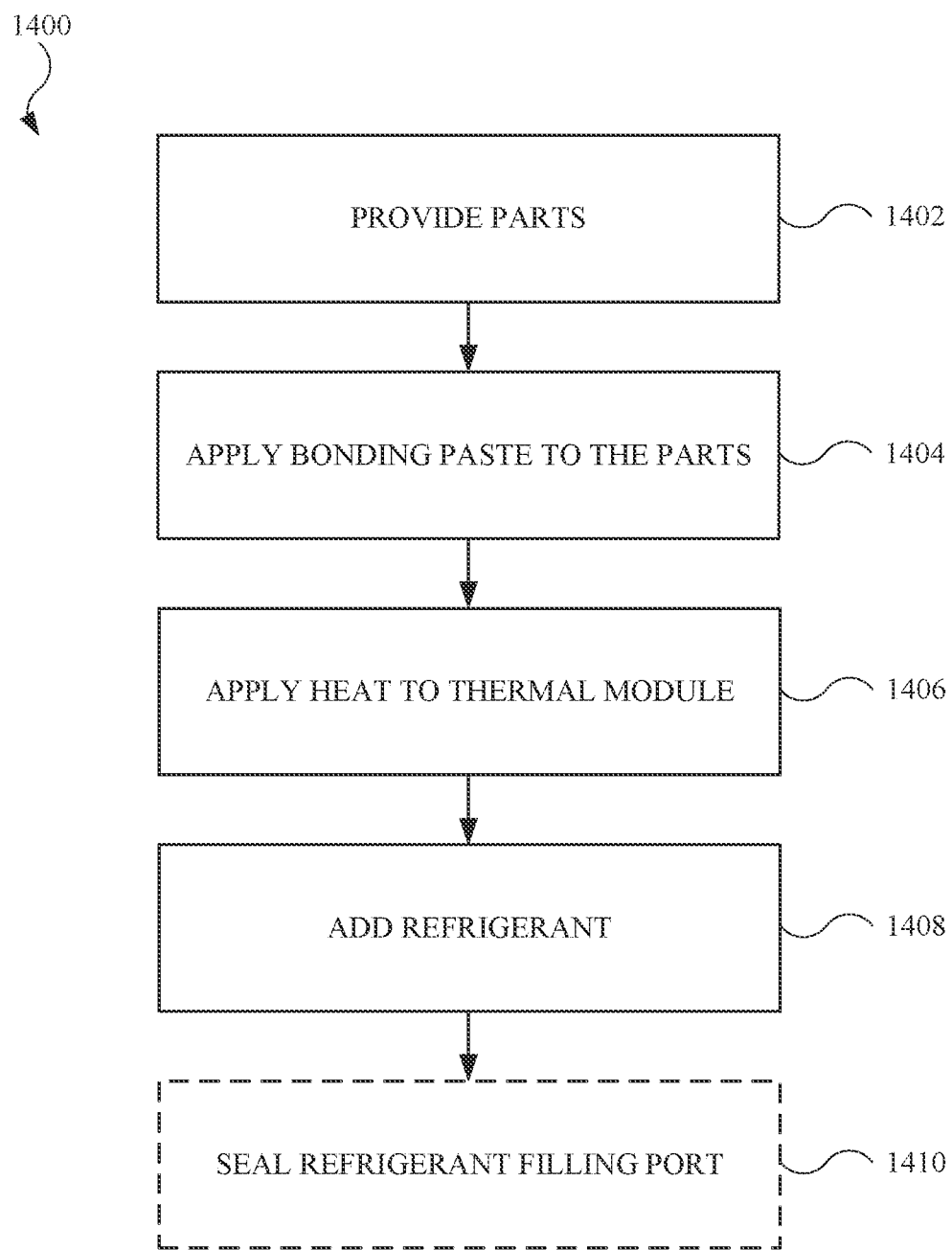
FIG. 16 illustrates a flowchart showing a process for assembling a thermal module, in accordance with aspect of the present disclosure.

Referring to FIG. 16, a flowchart 1400 showing a method for forming a thermal module is shown. The flowchart 1400 may be used to form one or more thermal modules shown and/or described herein.

In step 1402, parts (e.g., housing parts) are provided. The parts may include copper, copper alloy, or another relatively high thermally conductive metal(s). Further, at least one of the parts may include walls that forms a 90-degree, or approximately 90-degree, angle with respect to another wall or surface of the part, while the other part may include walls formed an angle that forms a 60- to 80-degree, or approximately 60- to 80-degree, angle with respect to another wall or surface of the part. As a result, the respective walls of the parts may be diverging walls that form an angle of 10 to 30 degrees, or approximately 10 to 30 degrees.

In step 1404, a bonding paste is applied to the parts. The bonding paste may include solder paste or copper paste, as non-limiting examples. The bonding paste may be placed between the diverging walls.

In step 1406, heat is applied to the thermal module. The thermal module may be placed in a brazing furnace, for example, which applies sufficient heat to reflow the bonding paste. Based on the diverging walls, the bonding paste may incur capillary forces that cause the bonding paste to extend further between the diverging walls, thus enhancing the joint and sealing capabilities. Additionally, the bonding paste, in liquid state due to the applied heat, can force out particles, debris, and/or air bubbles, thus providing a homogeneous structure.

In step 1408, a refrigerant is added. For example, the refrigerant may be added between the parts. The refrigerant may include water, as a non-limiting example. When the thermal module is in use, the refrigerant may be in a liquid state, a gas state, or a combination thereof.

Optionally, in step 1410, a port (used to add the refrigerant) is sealed. In one or more implementations, one of the first part or the second part includes a port and the other part includes an extension, or door, that can cover the port (after adding the refrigerant). The port can subsequently be shut and sealed by, for example, a bonding paste.

Additionally, prior to step 1402, a cleaning operation may be performed on the parts. For example, the parts may be placed in an ultrasonic cleaner. Also, an opening or hole may be formed in one of the parts. The opening may provide a vent for pressure equalization between an internal volume of a thermal module and the surrounding air. In particular, when heat is applied in step 1406, pressure within the thermal module may not increase substantially, based on the opening, and cause unwanted issues (e.g., parts decoupling). The opening can be sealed subsequent to step 1406.

Figure 17:
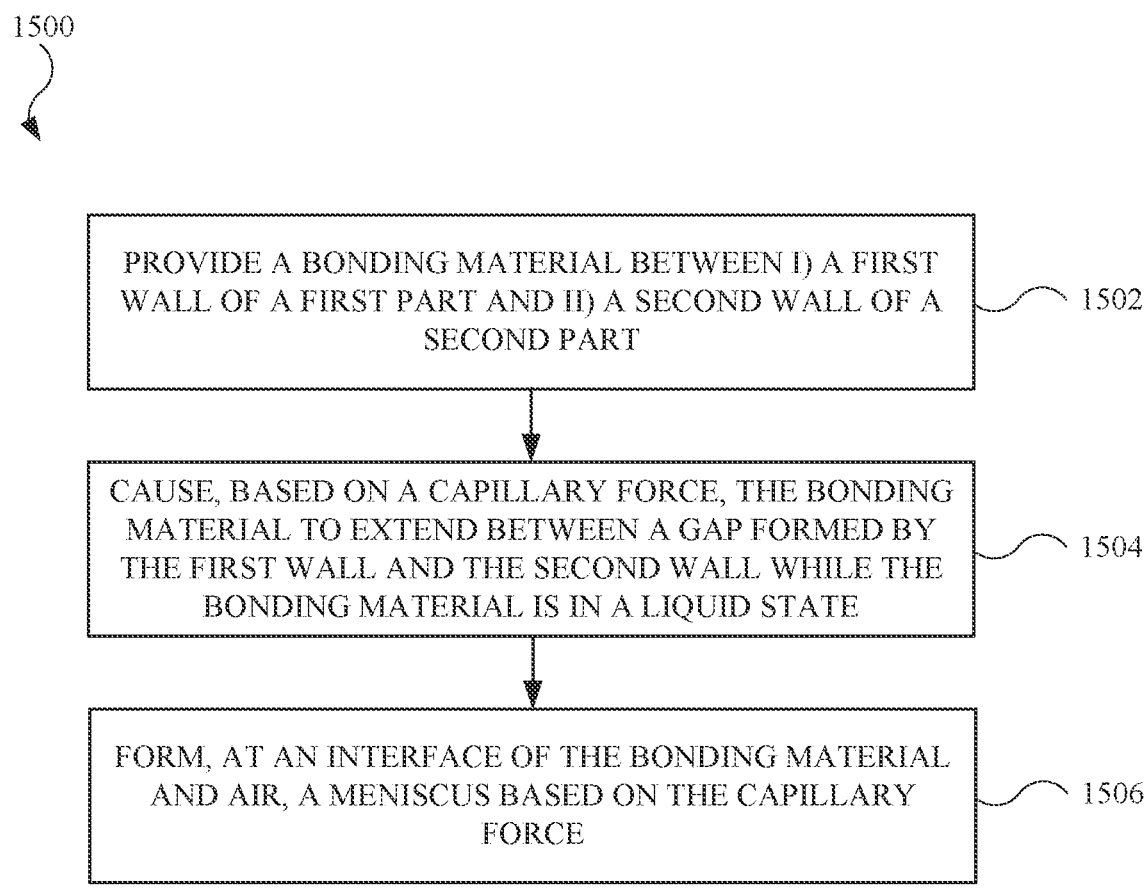
FIG. 17 illustrates a flowchart showing a process for joining housing parts that form an enclosure, in accordance with aspect of the present disclosure.

Referring to FIG. 17, a flowchart 1500 showing a method for joining housing parts that form an enclosure is shown. The flowchart 1500 may be used to form one or more thermal modules shown and/or described herein.

In step 1502, a bonding material is provided between i) a first wall of a first part and ii) a second wall of a second part. The bonding material may include a bonding paste that is deposited between the first wall and the second wall. The first wall and the second wall may diverge from each other.

In step 1504, based on a capillary force, the bonding material is caused to extend between a gap formed by the first wall and the second wall while the bonding material is in a molten or liquid state. The capillary force may be based on the first wall and the second wall being divergent walls.

In step 1506, at an interface of the bonding material and air, a meniscus is formed based on the capillary force. The bonding material may subsequently solidify into a solid body that form a joint between the first part and the second part. The solid body may also form a hermetic seal between the first part and the second part.

Various examples of aspects of the disclosure are described below as clauses for convenience. These are provided as examples, and do not limit the subject technology.

Clause A: A thermal module may include a first part that includes a first wall. The thermal module may further include a second part that includes a second wall. The second wall may be non-parallel with respect to the first wall, and the first wall and the second wall define a gap. The thermal module may further include a bonding paste configured to: extend along the gap between the first wall and the second wall, secure the first wall with the second wall, and provide a hermetic seal between the first wall and the second wall.

Clause B: A thermal module may include a first part that includes a first wall. The first part may define an internal volume. The thermal module may further include a second part disposed in the internal volume. The second part may include a second wall. The thermal module may further include a bonding paste positioned between the first wall and the second wall. In some examples, based on a separation between the first wall and the second wall, the bonding paste forms a meniscus.

Clause C: An electronic device may include a heat-generating component. The electronic device may further include a thermal module thermally coupled to the heat-generating component. The thermal module may include a first part that includes a first wall. The thermal module may further include a second part that includes a second wall. The second wall may be non-parallel with respect to the first wall, and the first wall and the second wall define a gap. The thermal module may further include a bonding paste configured to: extend along the gap between the first wall and the second wall, secure the first wall with the second wall, and provide a hermetic seal between the first wall and the second wall.

Clause D: A method for joining housing parts of a thermal module is described. The method may include providing a bonding paste between i) a first wall of a first part and ii) a second wall of a second part. The first wall and the second wall may diverge from each other. The method may further include applying heat to melt the bonding paste. The method may further include causing, based on a capillary force, the bonding paste to extend between a gap formed by the first wall and the second wall. The capillary force may be based on the first wall and the second wall being divergent walls. The method may further include forming, at the bonding paste, a meniscus based on the capillary force.

Clause E: A method for joining housing parts that form an enclosure is described. The method may include providing a bonding material between i) a first wall of a first part and ii)

a second wall of a second part. The bonding material may include a bonding paste. The first wall and the second wall may diverge from each other. The method may further include causing, based on a capillary force, the bonding material to extend between a gap formed by the first wall and the second wall while the bonding material is in a molten or liquid state. The capillary force may be based on the first wall and the second wall being divergent walls. The method may further include forming, at an interface of the bonding material and air, a meniscus based on the capillary force. The bonding material may subsequently solidify into a solid body that form a joint between the first part and the second part. The solid body may also form a hermetic seal between the first part and the second part.

One or more of the above clauses can include one or more of the features described below. It is noted that any of the following clauses may be combined in any combination with each other, and placed into a respective independent clause, e.g., clause A, B, C, D or E.

Clause 1: wherein the first wall is separated from the second wall by an angle of at least 10 degrees.

Clause 2: wherein the first wall is separated from the second wall by an angle of at least 20 degrees.

Clause 3: wherein: the first wall comprises an external wall, and the second wall comprises interior wall that is internal with respect to the first wall.

Clause 4: wherein the first wall includes: an end surface, and openings formed at the end surface.

Clause 5: wherein the bonding paste includes a meniscus.

Clause 6: wherein the bonding paste is selected from solder paste or copper paste.

Clause 7: wherein the hermetic seal forms a joint between the first part and the second part.

Clause 8: wherein: the first part further includes a third wall, and the first wall and the third wall form a right angle.

Clause 9: wherein the first wall is separated from the second wall by an angle of at least 10 degrees.

Clause 10: wherein the first wall is separated from the second wall by an angle of at least 20 degrees.

Clause 11: wherein based on the separation, the bonding paste, in a liquid state, is configured to extend along a gap between the first wall and the second wall.

Clause 12: wherein the bonding paste forms a hermetic seal between the first part and the second part.

Clause 13: wherein the first part further includes: a port configured to receive a liquid, and an extension configured to cover the port and retain the liquid.

Clause 14: wherein: the first part further includes a third wall, the first wall and the third wall form a right angle, and the first wall is separated from the second wall by an angle of at least 10 degrees.

Clause 15: wherein the hermetic seal forms a joint between the first part and the second part.

Clause 16: wherein the bonding paste forms a meniscus.

Clause 17: wherein the thermal module further includes: a wick structure formed on at least one of the first part or the second part.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A thermal module, comprising:
   a first part comprising a first wall;
   a second part comprising a second wall, wherein the second wall is angled such that the second wall is non-parallel with respect to the first wall to define a diverging portion, and the first wall and the second wall define a gap based on the diverging portion; and
   a bonding paste configured to:
      extend along and fill the gap between the first wall and the second wall,
      secure and engage the first wall with the second wall at the diverging portion, and
      provide a hermetic seal between the first wall and the second wall.

2. The thermal module of claim 1, wherein the first wall is separated from the second wall by an angle of at least 10 degrees.

3. The thermal module of claim 1, wherein the first wall is separated from the second wall by an angle of at least 20 degrees.

4. The thermal module of claim 1, wherein:
   the first wall comprises an external wall, and
   the second wall comprises interior wall that is internal with respect to the first wall.

5. The thermal module of claim 4, wherein the first wall comprises:
   an end surface, and
   openings formed at the end surface.

6. The thermal module of claim 1, wherein the bonding paste comprises a meniscus.

7. The thermal module of claim 1, wherein the bonding paste is selected from solder paste or copper paste.

8. The thermal module of claim 1, wherein the hermetic seal forms a joint between the first part and the second part.

9. A thermal module, comprising:
   a first part comprising a first wall, wherein the first part defines an internal volume;
   a second part disposed in the internal volume, the second part comprising a second wall; and
   a bonding paste positioned between the first wall and the second wall, wherein based on a separation between the first wall and the second wall, the bonding paste forms a concave meniscus.

10. The thermal module of claim 9, wherein:
    the first part further comprises a third wall, and
    the first wall and the third wall form a right angle.

11. The thermal module of claim 10, wherein the first wall is separated from the second wall by an angle of at least 10 degrees.

12. The thermal module of claim 10, wherein the first wall is separated from the second wall by an angle of at least 20 degrees.

13. The thermal module of claim 9, wherein based on the separation, the bonding paste, in a liquid state, is configured to extend along a gap between the first wall and the second wall.

14. The thermal module of claim 9, wherein the bonding paste forms a hermetic seal between the first part and the second part.

15. The thermal module of claim 9, wherein:
    concave meniscus is formed in part based on a pressure on the bonding paste based on an angle between the first part and the second part, and
    the angle is based on the separation.

16. An electronic device, comprising:
    a heat-generating component; and
    a thermal module thermally coupled to the heat-generating component, the thermal module comprising:
       a first part comprising a first wall and a second wall;
       a second part comprising a third wall, wherein the third wall is non-parallel with respect to the first wall and the second wall, and the first wall and the third wall define a gap; and
       a bonding paste engaged with the first wall, the second wall, and the third wall, the bonding paste configured to:
          extend along the gap between the first wall and the second wall,
          secure the first wall with the second wall,
          form a first concave meniscus between the first wall and the third wall,
          form a second concave meniscus between the second wall and the third wall, and
          provide a hermetic seal between the first wall and the second wall.

17. The electronic device of claim 16, wherein:
    the first wall and the third wall form a right angle, and
    the first wall is separated from the second wall by an angle of at least 10 degrees.

18. The electronic device of claim 16, wherein the hermetic seal forms a joint between the first part and the second part.

19. The electronic device of claim 16, wherein the bonding paste forms a meniscus.

20. The electronic device of claim 16, wherein the thermal module further comprises a wick structure formed on the first part or the second part.

* * * * *